United States Patent [19]
Ingalls

[11] Patent Number: 5,978,297
[45] Date of Patent: Nov. 2, 1999

[54] METHOD AND APPARATUS FOR STROBING ANTIFUSE CIRCUITS IN A MEMORY DEVICE

[75] Inventor: Charles L. Ingalls, Meridian, Id.

[73] Assignee: Micron Technology, Inc., Boise, Id.

[21] Appl. No.: 09/069,224

[22] Filed: Apr. 28, 1998

[51] Int. Cl.$^6$ .................................................. G11C 7/00
[52] U.S. Cl. .................. 365/225.7; 365/200; 365/230.06
[58] Field of Search ................................. 365/225.7, 200, 365/230.06, 226

[56] References Cited

U.S. PATENT DOCUMENTS

| | | | |
|---|---|---|---|
| 5,539,692 | 7/1996 | Kajigaya et al. | 365/189.01 |
| 5,587,866 | 12/1996 | Yach et al. | 361/90 |
| 5,627,478 | 5/1997 | Habersetzer et al. | 324/763 |
| 5,657,293 | 8/1997 | Merritt et al. | 365/233.5 |
| 5,781,483 | 7/1998 | Shore | 365/200 |
| 5,831,923 | 11/1998 | Casper | 365/225.7 |
| 5,886,940 | 3/1999 | Morzano et al. | 365/230.03 |

*Primary Examiner*—Viet Q. Nguyen
*Attorney, Agent, or Firm*—Seed and Berry LLP

[57] ABSTRACT

A method and apparatus for reading or strobing antifuse circuits in a memory device is described. A read signal, also called a strobe signal, is generated from a circuit which includes a model antifuse similar to antifuses employed in the antifuse circuits. The read signal is a single pulse having a duration determined by an amount of time needed to charge the model antifuse such that the read signal is long enough to be applied to properly read antifuse circuits in the memory device. A reset pulse may be generated having a duration determined by the amount of time needed to charge the model antifuse, and the reset pulse may be applied to initialize registers in the memory device and to generate the read signal.

23 Claims, 6 Drawing Sheets

METHOD AND APPARATUS FOR STROBING ANTIFUSE CIRCUITS IN A MEMORY DEVICE

TECHNICAL FIELD

The invention relates generally to integrated circuit memory devices, and more particularly, to a method for strobing antifuse circuits in a memory device.

BACKGROUND OF THE INVENTION

A conventional memory device is illustrated in FIG. 1. The memory device is a synchronous dynamic random access memory ("SDRAM") 10 that includes an address register 12 receiving either a row address and a bank address bit BA or a column address on an address bus 14. The address bus 14 is generally coupled to a memory controller (not shown in FIG. 1). Typically, a row address and a bank address are received by the address register 12, and applied to a row address multiplexer 18. The row address multiplexer 18 couples the row address to one of two row address latches 26 depending on the state of the bank address BA. Each of the row address latches 26 stores the row address and applies it to a row decoder 28, which applies various signals to a respective memory bank array 20, 22 as a function of the stored row address. The row address multiplexer 18 also couples row addresses to the row address latches 26 for the purpose of refreshing memory cells in the arrays 20, 22. The row addresses are generated for refresh purposes by a refresh counter 30 that is controlled by a refresh controller 32. The arrays 20, 22 are comprised of memory cells arranged in rows and columns.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42, which applies a sequence of column addresses to the column address buffer 44 starting at the column address output by the address register 12. In either case, the column address buffer 44 applies a column address to a column decoder 48, which applies various column signals to respective sense amplifiers and associated column circuits 50, 52 for the respective arrays 20, 22.

Data to be read from one of the arrays 20, 22 are coupled from the arrays 20, 22, respectively, to a data bus 58 through the column circuit 50, 52, respectively, and a read data path that includes a data output register 56. Data to be written to one of the arrays 20, 22 are coupled from the data bus 58 through a write data path, including a data input register 60, to one of the column circuits 50, 52 where they are transferred to one of the arrays 20, 22, respectively. A mask register 64 may be used to selectively alter the flow of data into the column circuits 50, 52 by, for example, selectively masking data to be written to the arrays 20, 22.

The above-described operation of the SDRAM 10 is controlled by a control logic circuit 66, which includes a command decode circuit 68 and a mode register 69. The control logic circuit 66 is responsive to high level command signals received from a control bus 70 through the command decode circuit 68. The high level command signals, which are typically generated by the memory controller, are a chip select signal CS*, a write enable signal WE*, a row address strobe signal RAS*, and a column address strobe signal CAS*. The memory controller also typically provides a clock enable signal CKE* and a clock signal CLK through the control bus 70 to the control logic circuit 66. The "*" designates the signal as active low. The control logic circuit 66 generates a sequence of command signals responsive to the high level command signals to carry out a function (e.g., a read or a write) designated by each of the high level command signals. The command signals, and the manner in which they accomplish their respective functions, are conventional. Therefore, in the interest of brevity, a further explanation of the command signals will be omitted.

Conventional memory devices such as the SDRAM 10 are tested to locate defects and failures before they are packaged. Predetermined data values are typically written to selected row and column addresses that correspond to memory cells, and voltage values are read from the memory cells to determine if the data read matches the data written to those memory cells. If the read data does not match the written data, then those memory cells are likely to contain defects which will prevent a proper operation of the SDRAM 10.

Nearly all memory devices such as the SDRAM 10 include redundant circuitry that may be employed to replace malfunctioning memory cells found during testing. The malfunctioning memory cells may be replaced by enabling the redundant circuitry such that the memory device need not be discarded even though it contains defective memory cells. In particular, memory devices typically employ redundant rows and columns of memory cells. If a memory cell in a column or a row of a primary memory array is defective, then an entire column or row of redundant memory cells can be substituted therefore.

Substitution of one of the redundant rows or columns is accomplished in a memory device such as the SDRAM 10 by opening a specific combination of fuses, or by closing a specific combination of antifuses, in one of several fuse or antifuse banks in the SDRAM 10. Conventional fuses are resistive devices which may be opened or broken with a laser beam or an electric current. Antifuses are capacitive devices that may be closed or blown by breaking down a dielectric layer in the antifuse with a relatively high voltage.

If the SDRAM 10 contains antifuses, a selected combination of antifuses are closed corresponding to an address of a defective row or column of cells in the SDRAM 10. For example, if the defective row or column has an 8-bit binary address of 00100100, then the appropriate antifuses in a set of 8 antifuses are closed to store this address. The antifuses are conventionally arranged in groups of 8, each group of 8 occupying one location in an antifuse bank.

The SDRAM 10 contains several antifuse banks 90 that are located between the address latches 26, 40 and the respective decoders 28, 48. The SDRAM 10 also includes a substantial number of registers 92 located in the control logic circuit 66 and in other areas of the SDRAM 10 as needed. The registers 92 are programmed with data to direct the operation of most elements in the SDRAM 10.

When an address in the SDRAM 10 is accessed, a compare circuit compares an incoming address to addresses stored in the antifuse banks 90 to determine whether the incoming address matches an address with a defective memory cell. If the compare circuit determines such a match, then it outputs a match signal to a controller or "phase generator" in a row or column decoder 28, 48, respectively. In response, the row or column decoder 28, 48 causes an appropriate redundant row or column to be accessed, and ignores the defective row or column in the array 20, 22.

As described above, antifuses are capacitive structures that, in their unblown states, form open circuits which may be charged to provide a corresponding rise in voltage. An antifuse may be blown by applying a relatively high voltage across it which causes the dielectric layer in the antifuse to break down and form a conductive path. Blown antifuses will conduct current while an unblown antifuse will not conduct current.

Individual antifuses are generally contained in antifuse circuits which generate a digital value or signal indicating whether the antifuse is blown or unblown. A conventional antifuse circuit 95 is illustrated in FIG. 2. The antifuse circuit 95 receives an operating voltage Vcc at a source of a PMOS transistor 96. The PMOS transistor 96 is coupled through two PMOS transistors 102, 104 in parallel to an input of an inverter 106. The input of the inverter 106 is coupled to a ground through two NMOS transistors 110, 112 connected in series. Gates of the PMOS transistor 102 and the NMOS transistor 110 receive a read fuse signal RDFUS* from an external source. The RDFUS* signal is an active low signal which is normally high to render the PMOS transistor 102 non-conductive and the NMOS transistor 110 conductive. The input of the inverter 106 is also coupled to a first terminal of an antifuse 114 through two NMOS transistors 116, 118. A gate of the NMOS transistor 116 receives a signal DVC2F which is slightly greater than one-half Vcc and maintains the NMOS transistor 116 in a conductive state. Similarly, a gate of the NMOS transistor 118 receives a boosted voltage Vccp that exceeds Vcc and maintains the NMOS transistor 118 in a conductive state. A junction between the NMOS transistors 116, 118 receives a bank select signal BSEL* through an NMOS transistor 120 having a gate receiving a fuse add signal FA. A second terminal of the antifuse 114 receives a common ground signal CGND.

The antifuse circuit 95 is programmed during manufacture of the SDRAM 10 after a test to determine which addresses in the SDRAM 10 are defective. During programming, the BSEL* signal is brought low and the CGND signal is raised to about ten volts. Selected antifuses, such as the antifuse 114, are blown when the fuse add signal FA is brought high to render the NMOS transistor 120 conductive to allow current through the antifuse 114 and the NMOS transistors 118, 120. The current breaks down the dielectric layer in the antifuse 114. If the antifuse 114 is to remain unblown the fuse add signal FA is kept low such that the NMOS transistor 120 prevents current through the antifuse 114. The signals BSEL*, FA, and CGND are used only during the manufacture of the SDRAM 10 to program antifuse circuits. During operation of the SDRAM 10, the fuse add signal FA is held low to render the NMOS transistor 120 non-conductive, and the common ground signal CGND is coupled to ground through a transistor (not shown).

The antifuse circuit 95 indicates whether the antifuse 114 is blown or unblown with a signal at an output of the inverter 106. The antifuse circuit 95 must be read by an active low pulse in the RDFUS* signal to generate the signal. When the RDFUS* signal is brought low, the PMOS transistor 102 is rendered conductive to couple Vcc to the first terminal of the antifuse 114 through the transistors 96, 102, 116, 118. If the antifuse 114 is unblown and thus remains non-conductive, the antifuse 114 is charged. The voltage at the input of the inverter 106 is allowed to rise with the voltage on the terminal of the antifuse 118 because the NMOS transistors 116, 118 are ON. As the voltage rises above a threshold voltage of the inverter 106, the inverter 106 outputs a low to indicate that the antifuse 114 is unblown. Gates of the PMOS transistor 104 and the NMOS transistor 112 are connected to the output of the inverter 106 so that the transistor 104 latches the signal at the output of the inverter 106 and the transistor 112 is switched OFF when the RDFUS* signal is brought high at the end of its pulse to turn ON the transistor 110.

If the antifuse 114 is blown such that it conducts current, then the input of the inverter 106 is held at substantially zero volts despite Vcc being applied to the input of the inverter 106 through the PMOS transistors 96, 102. When the RDFUS* signal is brought high, the input of the inverter 106 will remain low and its output will be high. As a result, the PMOS transistor 104 is turned OFF and the NMOS transistor 112 is turned ON to latch the output of the inverter 106 high. The signal at the output of the inverter 106 thereby indicates the state of the antifuse 114 and provides one digit of an address of a defective row or column.

In a conventional memory device, such as the SDRAM 10 shown in FIG. 1, the antifuse circuits 95 are read when an operating voltage Vcc is initially supplied to the SDRAM 10 in a boot up procedure. A power up pulse is generated in the control logic circuit 66 as a single pulse with a duration approximately equal to the duration of the power up pulse. The power up pulse may be generated by conventional means. Thereafter, the antifuse circuits 95 are read each time the SDRAM 10 is accessed and the RDFUS* signal is generated as a pulse with a nominal duration of, for example, 5 to 15 nanoseconds.

Often, the power up pulse is short because there is a spike in the rising Vcc, or the power up pulse is not generated with the appropriate power ramp rate. The resulting RDFUS* signal will not be long enough to properly read the antifuse circuits 95. In addition, the antifuse circuits 95 may not be read properly if Vcc has not risen to a level sufficient to drive logic in the SDRAM 10.

These problems may be overcome as the antifuse circuits 95 are read each time the SDRAM 10 is accessed, but frequent reading of large numbers of antifuse circuits 95 dissipates a substantial amount of power and slows down read and write operations.

The nominal duration of the RDFUS* signal pulse is selected to be long enough to read antifuse circuits 95 in any SDRAM 10 even though physical characteristics of the antifuse circuits 95 and transistors may vary substantially between devices. For example, the antifuses 114 of a selected SDRAM 10 may have substantially greater capacitance than the antifuses 114 in other SDRAMs 10, and similarly, the transistors in a selected SDRAM 10 may offer substantially different resistance to current than the transistors in other SDRAMs 10 due to inherent variations in the processing of large numbers of semiconductor chips. Furthermore, the user of an SDRAM 10 will select Vcc, which influences the amount of time required to charge the antifuses 114. Finally, temperature changes in the SDRAM 10 affect the amount of time needed to charge the antifuses 114 through changes in leakage and junction capacitances. To compensate for all the possible sources of variance in the amount of time needed to read an antifuse circuit 95 in an SDRAM 10, the duration of the RDFUS* signal pulse is selected to be long enough to read the antifuse circuits 95 under the slowest conditions. For most SDRAMS 10 the RDFUS* signal pulse is unnecessarily long which slows the operation of the SDRAM 10 and causes unnecessary power dissipation.

SUMMARY OF THE INVENTION

The present invention provides a method and apparatus for reading or strobing antifuse circuits in a memory device using a model antifuse. The model antifuse is preferably an antifuse like the antifuses in the antifuse circuits, and it is used solely for the purpose of setting the duration of a read signal. A trigger signal is generated and the read signal is generated in response to the trigger signal and applied to read the antifuse circuits. The model antifuse is charged in response to the trigger signal, and the read signal is terminated when the model antifuse is charged to a predetermined level. The trigger signal may be generated by providing high level command signals to the memory device, generating a load mode register command in response to the high level command signals, and generating the trigger signal in response to the load mode register command. A mode register in the memory device may be programmed in response to the load mode register command. A reset signal may be generated between the trigger signal and the moment when the model antifuse is charged to the predetermined level. The reset signal may be used to generate a read signal and initialize registers in the memory device.

DETAILED DESCRIPTION OF THE INVENTION

Figure 1:
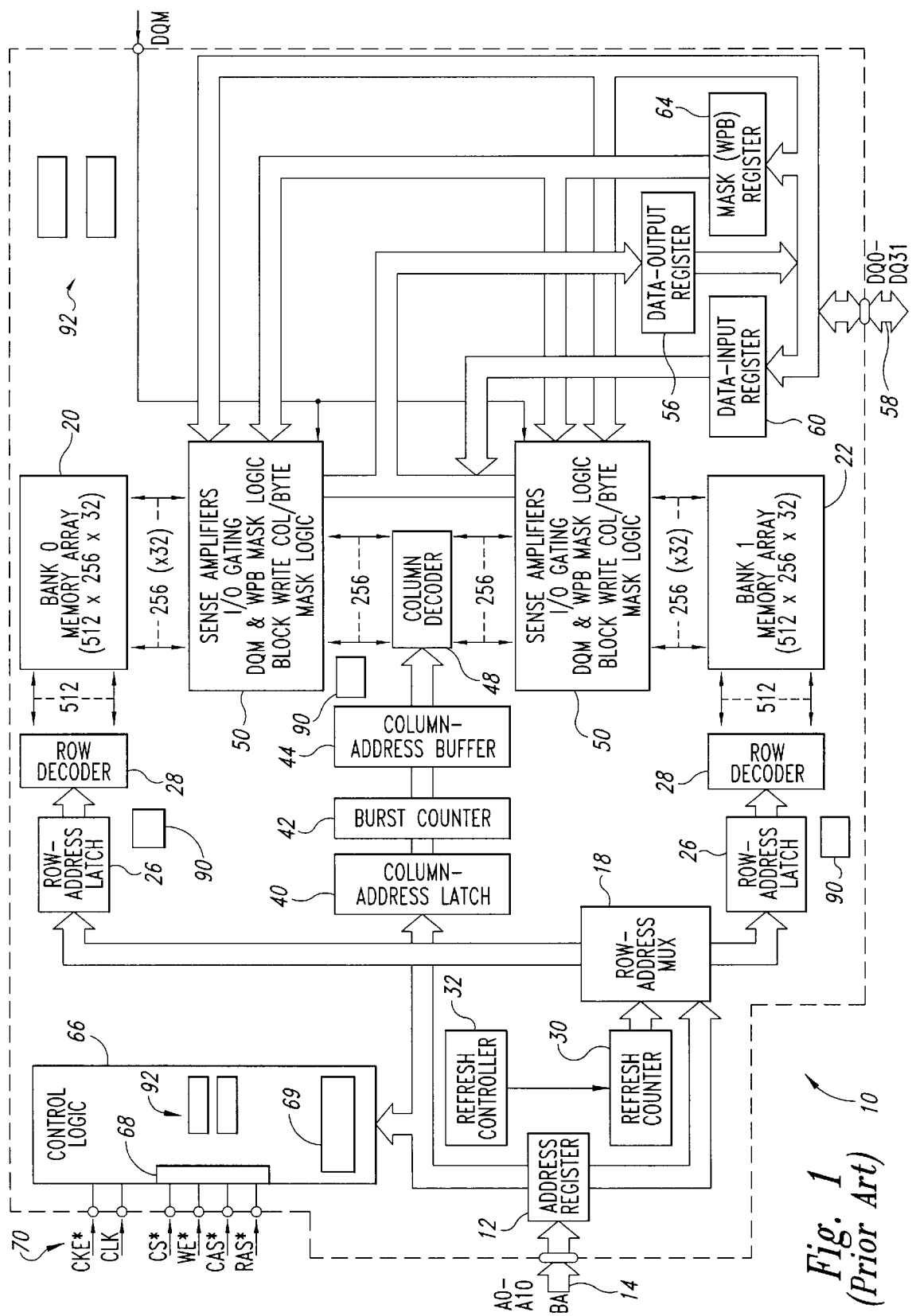
FIG. 1 is a block diagram of a memory device according to the prior art.

In a memory device such as the SDRAM 10 shown in FIG. 1 a load mode register command (LMR) is generated by the control logic circuit 66 to program the mode register 69 with information. The LMR is a single pulse of a limited duration that is generated by the control logic circuit 66 in response to a selected set of high level command signals. The information defines a specific mode of operation of the SDRAM 10 by defining a burst length, a burst type, a CAS latency, an operating mode, and a write burst mode in addition to other operating parameters. The mode register 69 is programmed any time the SDRAM 10 is initialized. For example, the mode register 69 is programmed during a boot up procedure for a computer including the SDRAM 10 after Vcc has reached a stable level. The mode register 69 is also programmed during a reboot procedure when the computer is reinitialized and Vcc is not interrupted. The use of an LMR pulse to program a mode register in an SDRAM is well known to those skilled in the art, and will not be further described herein for purposes of brevity.

Figure 2:
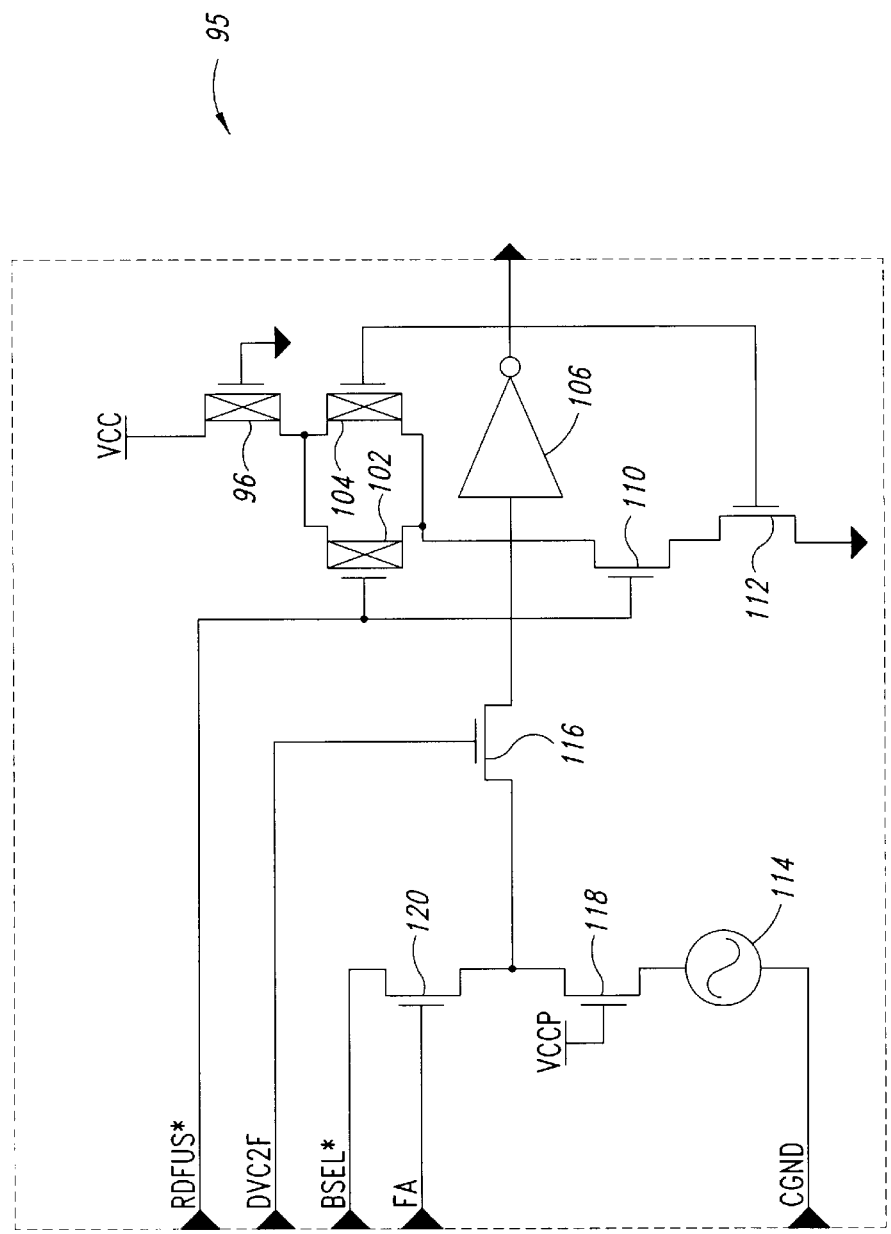
FIG. 2 is a schematic diagram of an antifuse circuit according to the prior art.
Figure 3:
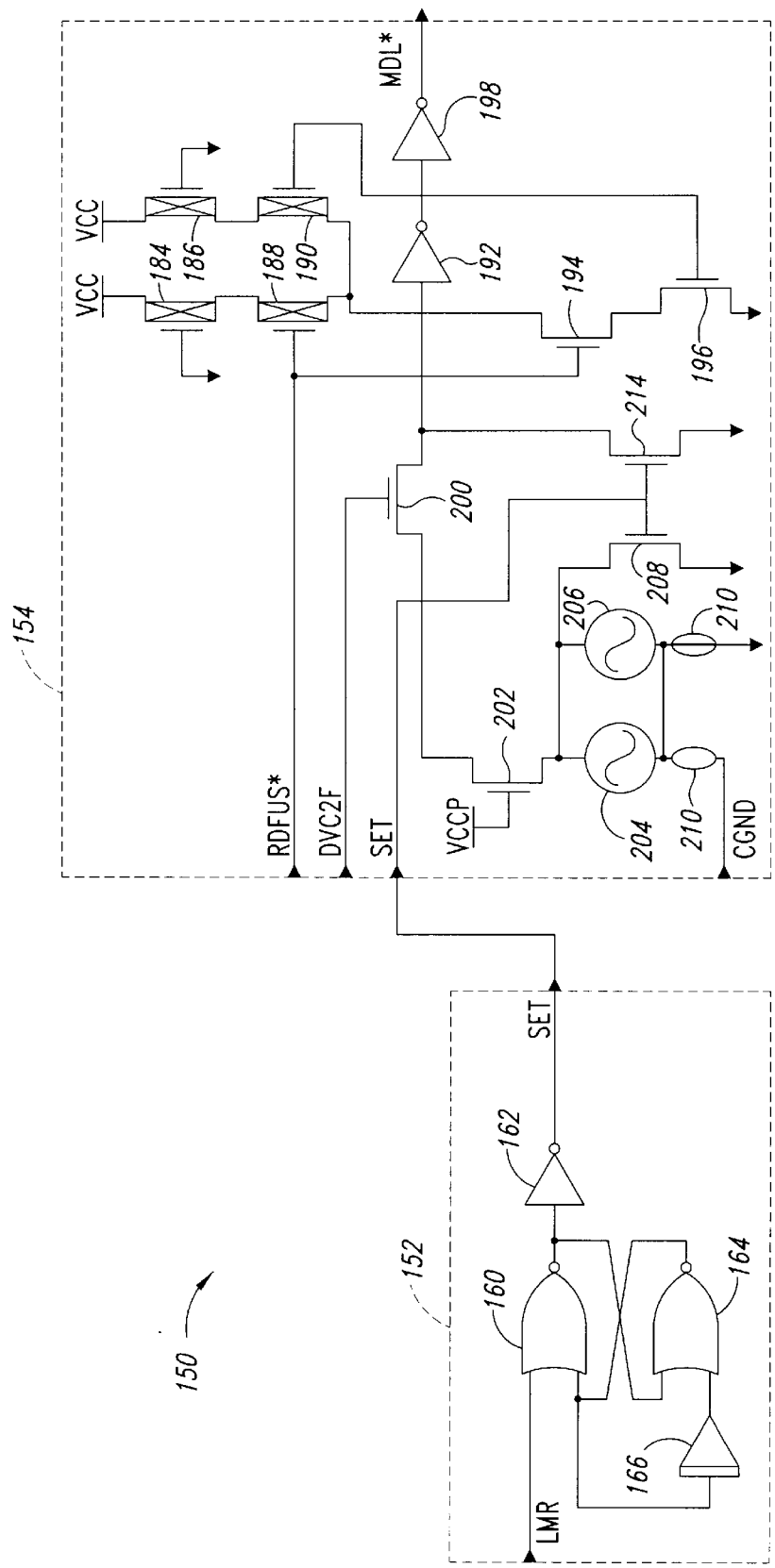
FIG. 3 is a schematic diagram of a circuit for controlling a read signal according to an embodiment of the present invention.

A circuit 150 for governing a duration of a read signal RDFUS* for the antifuse circuits 95 in the SDRAM 10 according to one embodiment of the invention is shown in FIG. 3. The circuit 150 includes a latch circuit 152 for generating a SET pulse in response to the LMR pulse, and a model antifuse circuit 154 for generating an MDL* pulse in response to the SET pulse. The read signal RDFUS* is generated as a single RDFUS* pulse approximately as long as the MDL* pulse. The RDFUS* pulse is generated in a circuit shown in FIG. 4 in response to the MDL* pulse, and must be long enough to charge the antifuse 114 in the antifuse circuit 95, shown in FIG. 2, with Vcc. The model antifuse circuit 154 ensures that the RDFUS* pulse is long enough by generating the MDL* pulse while two model antifuses are being charged in the model antifuse circuit 154. The model antifuse circuit 154 includes components arranged in a manner substantially similar to the arrangement of components in the antifuse circuit 95, it receives the same Vcc, and it operates at the same temperature. If the components in the antifuse circuit 95 are changed for design or manufacturing reasons, the components in the model antifuse circuit 154 change accordingly. In addition, each model antifuse is similar to the antifuse 114. The model antifuse circuit 154 thereby reproduces the conditions in the antifuse circuits 95 and is capable of generating the MDL* pulse to be long enough to charge the antifuses 114. Two model antifuses are charged in the model antifuse circuit 154 so that the RDFUS* pulse is more than long enough to charge the antifuse 114 even if the antifuse 114 has an unusually large capacitance.

The latch circuit 152 will now be described in more detail. The latch circuit 152 includes a first NOR gate 160 having a first input coupled to receive the LMR pulse from the control logic circuit 66 (FIG. 1). The NOR gate 160 is connected to an input of an inverter 162. The NOR gate 160 and a second NOR gate 164 are coupled to each other to form a flip-flop. A delay circuit 166 is connected between an output and an input of the NOR gate 164 so that the flip-flop formed by the NOR gates 160, 164 is set following a short delay after being reset by the LMR pulse. An output of the inverter 162 is coupled to provide the SET pulse to the model antifuse circuit 154.

The latch circuit 152 operates to generate the SET pulse in the following manner. Before the arrival of the LMR pulse, which is active high, the first input of the NOR gate 160 is low as is the output of the NOR gate 164. The output of the NOR gate 160 is high and the output of the inverter 162 is low. The leading edge of the LMR pulse drives the output of the NOR gate 160 low to reset the flip-flop. The output of the inverter 162 then outputs a high to produce the SET pulse. The low output of the NOR gate 160 also drives the output of the NOR gate 164 high since the output of the delay circuit 166 is initially low. When the LMR pulse ends, the output of the NOR gate 160 remains reset because of the high at the output of the NOR gate 164. After a selected delay period defined by the delay circuit 166, the flip-flop is set again. The output of the NOR gate 164 is then driven low, and the output of the NOR gate 160 is driven high to cause the SET pulse to be terminated at the output of the inverter 162. The latch circuit 152 thereby generates the SET pulse to be longer than the LMR pulse.

The model antifuse circuit 154 will now be described. An operating voltage is applied to the respective sources of a pair of PMOS transistors 188, 190 through respective PMOS transistors 184, 186 that are biased ON because their gates are coupled to ground. The transistors operate in the same manner as the PMOS transistors 102, 104 shown in FIG. 2. The transistor 190 turns ON to latch the output of an inverter 192 low, and the transistor 188 applies a high to the input of the inverter 192 when the RDFUS* signal goes low.

The output of the inverter 192 is connected to an input of a second inverter 198 which generates the MDL* pulse. The input of the inverter 192 is coupled to ground through two NMOS transistors 194, 196. The transistors 194, 196 operate in the same manner as the NMOS transistors 110, 112 shown in FIG. 2.

The input of the first inverter 192 is also coupled through two NMOS transistors 200, 202 to first terminals of two antifuses 204, 206, and to ground through an NMOS transistor 208. A gate of the NMOS transistor 200 receives a signal DVC2F which is approximately one-half of Vcc and maintains the NMOS transistor 200 in a conductive state. The NMOS transistor 202 is maintained in a conductive state by a boosted voltage Vccp coupled to its gate that is greater than Vcc. Second terminals of the antifuses 204, 206 are connected together and may be coupled to ground through a first jumper option 210. The second terminals may also be coupled to receive a common ground signal CGND through a second jumper option 212. Either one of the options 210, 212 may be made conductive during the manufacture of the SDRAM 10 to couple the antifuses 204, 206 to ground or to the CGND signal, and the remaining option 210, 212 is left as an open circuit. The model antifuse circuit 154 will more closely reproduce the operation of the antifuse circuits 95 when the antifuses 204, 206 are coupled to the CGND signal which may fluctuate periodically above ground. The antifuses 204, 206 are charged periodically to a predetermined level to determine the duration of the MDL* pulse during the operation of the SDRAM 10 and are therefore never blown.

The input of the first inverter 192 is also coupled to ground through an NMOS transistor 214. Gates of the NMOS transistors 208, 214 are connected together to receive the SET pulse from the latch circuit 152. When the SET pulse occurs, the NMOS transistors 208, 214 are rendered conductive to discharge the antifuses 204, 206 and bring the input of the inverter 192 low.

The model antifuse circuit 154 operates to generate the MDL* pulse in the following manner. Before the arrival of the SET pulse, the RDFUS* signal is high such that the PMOS transistor 188 is non-conductive and the NMOS transistor 194 is conductive. The SET pulse discharges the antifuses 204, 206 and forces the input of the inverter 192 low causing the inverter 192 to output a high, thereby driving the output of the second inverter 198 low to initiate the MDL* pulse. The RDFUS* pulse is generated in response to the MDL* pulse after a few gate delays by the circuit shown in FIG. 4 that is described below.

The RDFUS* pulse renders the PMOS transistor 188 conductive and the NMOS transistor 194 non-conductive such that Vcc is coupled through the PMOS transistors 184, 188 to the input of the inverter 192 which is still grounded by the SET pulse through the NMOS transistor 214. When the SET pulse ends, the NMOS transistors 208, 214 are rendered non-conductive, and Vcc charges the antifuses 204, 206 through the PMOS transistors 184, 188 and the NMOS transistors 200, 202. The voltage at the first terminals of the antifuses 204, 206 rises as they are charged, and this voltage is applied to the input of the inverter 192 through the NMOS transistors 200, 202. When the voltage at the input of the inverter 192 rises to a threshold voltage, the inverter 192 outputs a low to cause the inverter 198 to end the MDL* pulse. The RDFUS* signal then transitions high in response to the end of the MDL* pulse by the circuit shown in FIG. 4. The high RDFUS* signal renders the PMOS transistor 188 non-conductive and the NMOS transistor 194 conductive. The low output of the inverter 192 turns ON the PMOS transistor 190 and turns OFF the NMOS transistor 196 to latch the output of the inverter 198 high by coupling the input of the inverter 192 to Vcc through the PMOS transistors 186, 190. The transistors 190, 196 are employed as a latch in this manner to prevent the generation of the MDL* pulse before another SET pulse arrives.

The RDFUS* pulse thereby has a leading edge approximately coincident with a leading edge of the SET pulse and a trailing edge responsive to the antifuses 204, 206 being charged to the threshold voltage of the inverter 192. The RDFUS* pulse has a duration approximately equal to the duration of the SET pulse plus the amount of time required to charge the antifuses 204, 206, which is sufficiently long to read the antifuse circuits 95 without being unnecessarily long. The capability of the model antifuse circuit 154 to provide a RDFUS* pulse of an appropriate duration is based on its similarity, both in structure and operation, to the antifuse circuits 95. If the period of time needed to charge the antifuses 114 and the antifuse circuits 95 changes because of design changes, manufacturing process variations, temperature changes, or a slightly different Vcc, the duration of the RDFUS* pulse will be adjusted accordingly by the model antifuse circuit 154, which is modified along with the antifuse circuits 95. Two antifuses 204, 206 are employed in the model antifuse circuit 154 to ensure that the RDFUS* pulse is long enough to charge an antifuse 114 with an unusually large capacitance. A single antifuse could be used in place of the pair of antifuses 204, 206 if there is only minimal variation in the capacitance of the antifuses 114 and the extra margin of safety is unnecessary.

Figure 4:
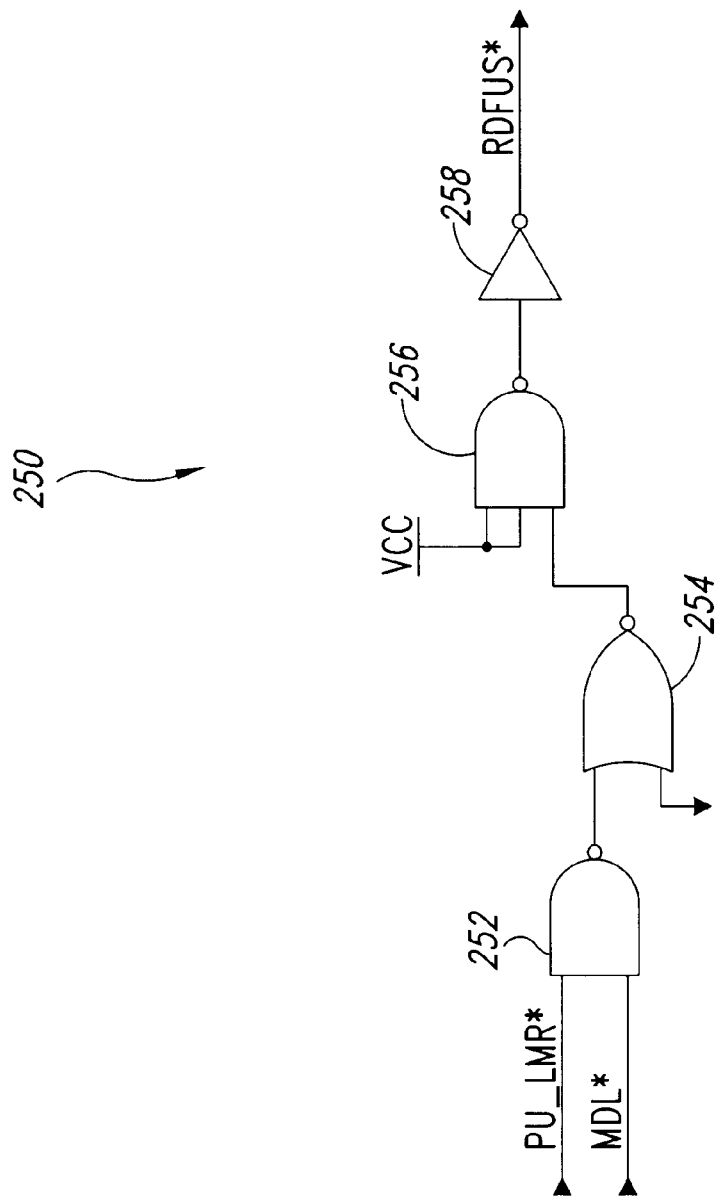
FIG. 4 is a block diagram of a circuit for generating the read signal controlled by the circuit shown in FIG. 3 according to an embodiment of the present invention.

The RDFUS* pulse is generated by a logic circuit 250 shown in FIG. 4 according to an embodiment of the invention. A first input of a first NAND gate 252 receives a power up pulse PU_LMR* that is provided as a single active low pulse from the control logic circuit 66 during the boot up procedure. A second input of the NAND gate 252 is coupled to the output of the inverter 198 in the model antifuse circuit 154 shown in FIG. 3 to receive the MDL* pulse. The logic circuit 250 generates the RDFUS* pulse whenever it receives the PU_LMR* pulse or the MDL* pulse. When either one of these signals is low, the NAND gate 252 outputs a high, a NOR gate 254 outputs a low, a second NAND gate 256 outputs a high, and an inverter 258 outputs the RDFUS* pulse. The logic circuit 250 thereby generates the active low RDFUS* pulse with a duration approximately equal to the duration of either the PU_LMR* pulse or the MDL* pulse. The RDFUS* pulse is coupled back to the model antifuse circuit 154 shown in FIG. 3 to be applied to the gates of the transistors 188, 194.

The circuit 150 shown in FIG. 3 and the logic circuit 250 shown in FIG. 4 operate to generate the RDFUS* pulse to be long enough to properly read the antifuse circuits 95 in the SDRAM 10. The RDFUS* pulse is initiated after a few logic gate delays in response to the LMR pulse which is converted into the longer SET pulse by the latch circuit 152. During the SET pulse, coincident with a first part of the RDFUS* signal pulse, the antifuses 204, 206 are discharged. Following the SET pulse the duration of the RDFUS* pulse is governed by the amount of time needed to charge the antifuses 204, 206 from a grounded state to the threshold voltage of the first inverter 192. As the RDFUS* pulse is ended with a trailing edge, the output of the model antifuse circuit 154 is latched to prevent another RDFUS* pulse from being generated until the next LMR pulse. One set of the circuits 150, 250 generates the RDFUS* pulse for all the antifuse circuits 95 in the SDRAM 10.

The use of the antifuses 204, 206 in the model antifuse circuit 154 to establish the duration of the RDFUS* pulse eliminates the need to choose an arbitrarily long RDFUS* pulse. The antifuses 204, 206 are fabricated on the same semiconductor chip and have similar capacitance characteristics as the other antifuses in the SDRAM 10. The RDFUS* signal pulse therefore does not have to be long enough to accommodate for chip to chip variations in the antifuses. This is also true for the transistors in the model antifuse circuit 154. Furthermore, since the circuit 150 and the logic circuit 250 are located on the same chip as the antifuse circuits 95 they receive the same Vcc and are subject to the same temperature conditions so that the duration of the RDFUS* pulse does not have to be extended to compensate for these sources of variation. The antifuses and the transistors may vary slightly in a single chip, but the RDFUS* pulse is generated to be more than long enough to charge two antifuses 204, 206 which ensures that it is long enough to compensate for these sources of variance. The sufficiency of the duration of the RDFUS* pulse is ensured by the similarities between the model antifuse circuit 154 and the antifuse circuits 95.

Another advantage of the embodiments of the invention described above is that the RDFUS* pulse is generated in response to the LMR pulse. The LMR pulse is generated after the power up pulse in the boot up procedure for the computer including the SDRAM 10 when Vcc has reached a stable level. This ensures that the antifuse circuits 95 are properly read even if the power up pulse was not long enough to do so, and that logic in the SDRAM 10 is receiving a stable Vcc while the antifuse circuits 95 are being read. The LMR pulse is also generated, and the antifuse circuits 95 are read, during reboots of the computer system. The reboots occur frequently such that the antifuse circuits 95 do not need to be read every time the SDRAM 10 is accessed. As a result, the SDRAM 10 is operated with much less power consumption and carries out read operations much more quickly.

Figure 5:
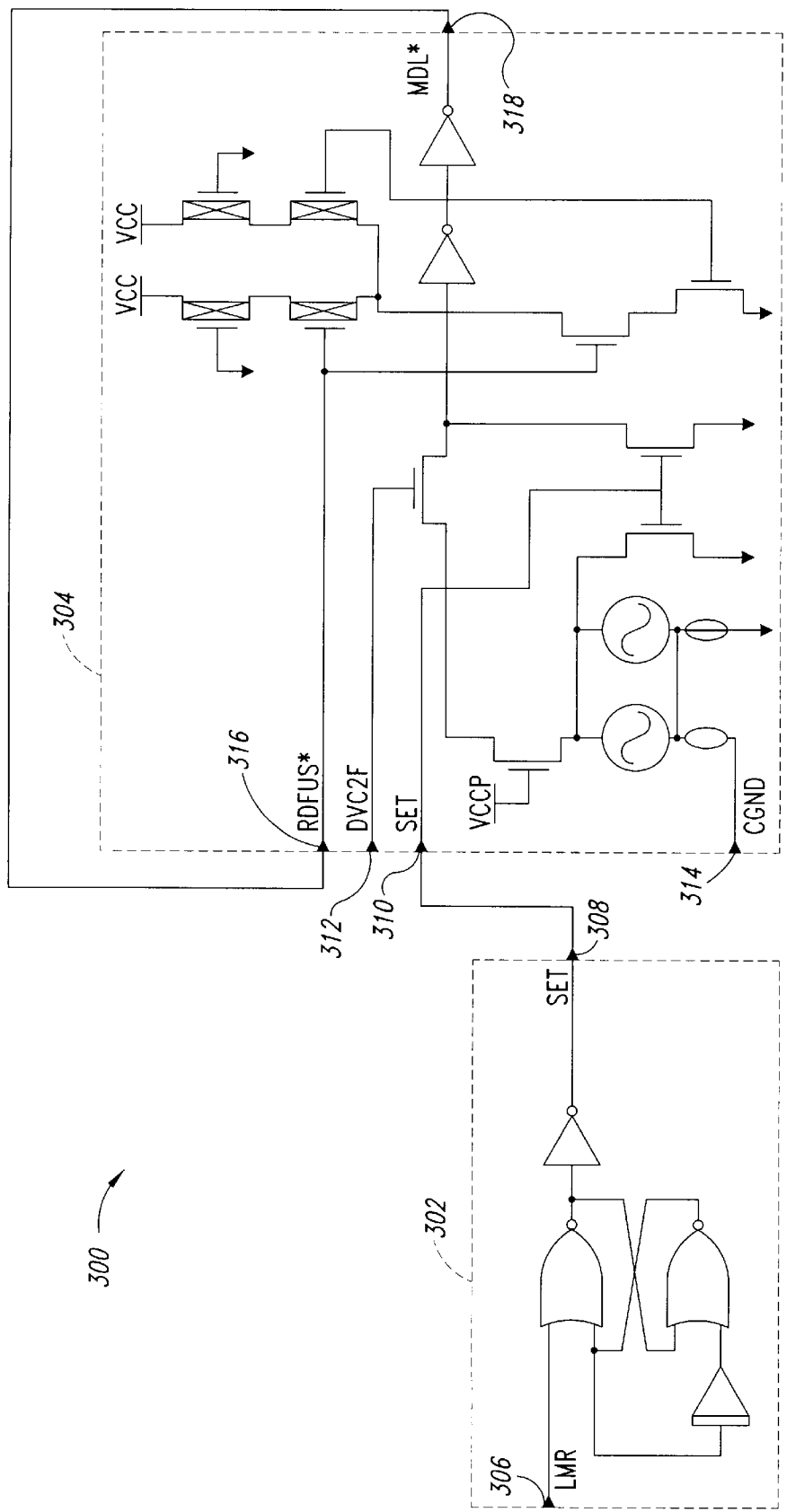
FIG. 5 is a schematic diagram of a circuit for generating an initialization pulse according to an embodiment of the present invention.

A circuit 300 shown in FIG. 5 according to an embodiment of the invention is capable of generating a reset pulse. The reset pulse is an active low pulse provided to a circuit (not shown) similar to the logic circuit 250 shown in FIG. 4 to generate a read fuse RDFUS* pulse for reading antifuse circuits in an SDRAM similar to the SDRAM 10 shown in FIG. 1. The circuit 300 includes a latch circuit 302 and a model antifuse circuit 304 that are similar to the latch circuit 152 and the model antifuse circuit 154, respectively, shown in FIG. 3, and that operate in a similar manner. Therefore, the elements in the latch circuit 302 and the model antifuse circuit 304 will not be described or provided with reference numerals for purposes of brevity. Instead, each circuit will be given reference numerals to identify inputs and outputs, and the signals at those inputs and outputs will be described in detail.

The latch circuit 302 includes an input 306 that receives the LMR pulse from the control logic circuit 66. An output 308 of the latch circuit 302 is coupled to an input 310 of the model antifuse circuit 304 to transfer a SET pulse in response to the LMR pulse. The model antifuse circuit 304 includes a second input 312 that receives a DVC2F voltage, which is approximately one-half of Vcc. A third input 314 receives a common ground signal CGND which is held to ground during operation of the SDRAM 10, and a fourth input 316 receives the reset pulse from an output 318 of the model antifuse circuit 304. The model antifuse circuit 304 generates the reset pulse in a manner similar to the manner in which the model antifuse circuit 154 shown in FIG. 3 generates the MDL* pulse.

The reset pulse is applied to the circuit similar to the circuit shown in FIG. 4 to generate the RDFUS* signal pulse to read the antifuse circuits 95 in the SDRAM 10 (FIG. 1). The reset pulse may also be applied to initialize the registers 92 in the SDRAM 10.

The registers 92 in the SDRAM 10 are programmed with data during the operation of the SDRAM 10 to define modes of operation in the SDRAM 10. The registers 92 include an input mode register, an output mode register, a register for output buffers, and a register for initializing the control logic circuit 66. These and many more registers 92 are located across the SDRAM 10 as needed. The registers 92 are made up of latches that are in an unknown state prior to the boot up procedure and are initialized or put into a known state by a pulse before the SDRAM 10 begins operating. The initialization of the registers 92 prevents elements in the SDRAM 10 from behaving in an uncontrolled manner. For example, the register for an output buffer indicates when data is to be driven onto a bus and when the output buffer is to be tri-stated. If the output buffer was allowed to drive data onto the bus in a random fashion, a conflict over buses in the SDRAM 10 would occur, leading to bus contention and possibly other problems.

A proper operation of the memory device depends upon the initialization of the registers 92 and the reading of the antifuse circuits 95. In a conventional SDRAM 10 these tasks are accomplished by the power up pulse in the boot up procedure, which, as described above, may be too short to properly read the antifuse circuits 95 and initialize the registers 92. The embodiment of the invention shown in FIG. 5 provides the reset pulse to read the antifuse circuits 95 and initialize the registers 92 during the boot up and reboot procedures with all of the advantages of the embodiments of the invention previously discussed.

Figure 6:
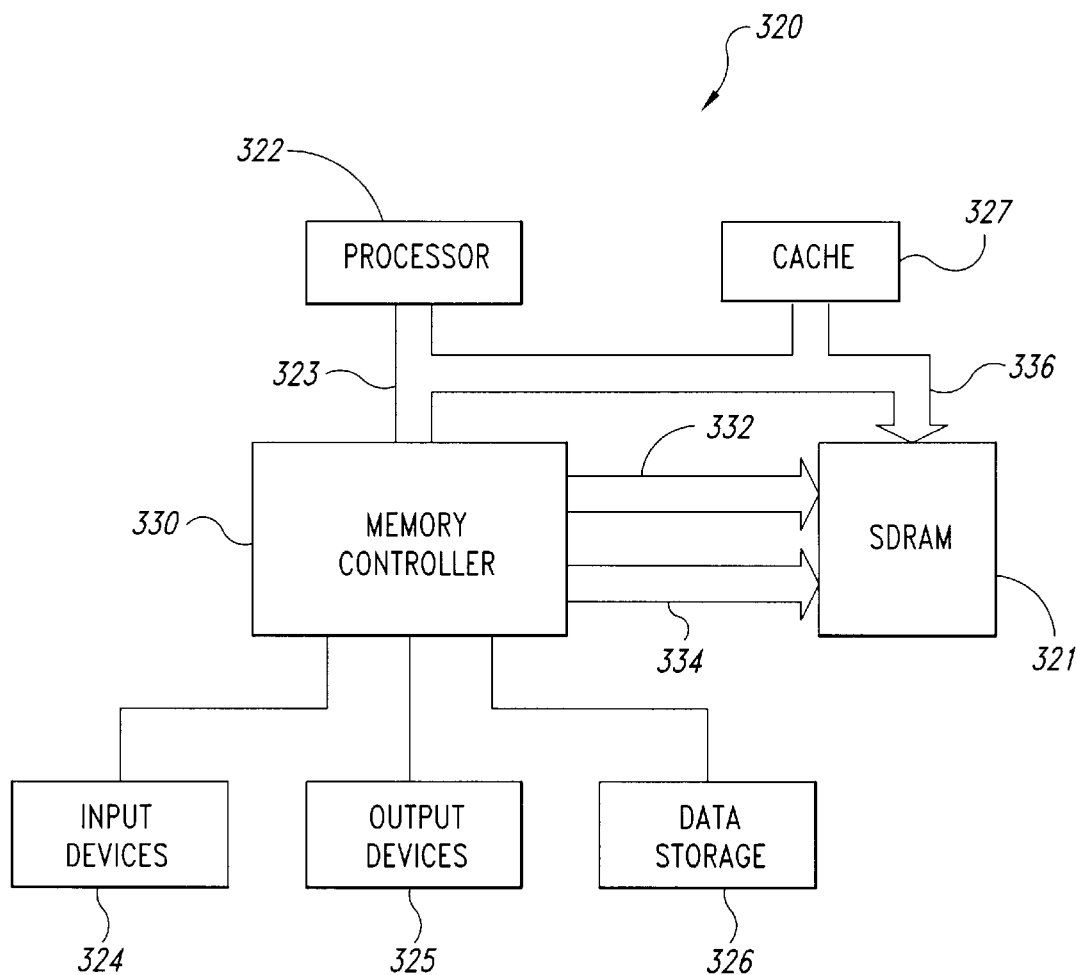
FIG. 6 is a block diagram of a computer system including the circuits shown in FIGS. 3 and 4 or 5.

FIG. 6 is a block diagram of a computer system 320 that includes an SDRAM 321 having circuits similar to those shown in FIGS. 3 and 4 according to the embodiments of the invention described above. In the alternative, the SDRAM 321 may include a circuit similar to the circuit 300 shown in FIG. 5. The computer system 320 includes a processor 322 for performing various computing functions, such as executing specific software to perform specific calculations or tasks. The processor 322 includes a processor bus 323 that includes an address bus, a control bus, and a data bus. In addition, the computer system 320 includes one or more input devices 324, such as a keyboard or a mouse, coupled to the processor 322 to allow an operator to interface with the computer system 320. The computer system 320 also includes one or more output devices 325 coupled to the processor 322, such as a printer or a video terminal. One or more data storage devices 326 may also be coupled to the processor 322 to allow the processor 322 to store data or retrieve data from internal or external storage media (not shown). Examples of typical storage devices 326 include hard and floppy disks, tape cassettes, and compact disk read-only memories (CD-ROMs). The processor 322 is also coupled to a cache memory 327, which is a static random access memory ("SRAM"), and to the SDRAM 321 through a memory controller 330. The memory controller 330 includes a control bus 332 and an address bus 334 which are coupled to the SDRAM 321. A data bus 336 is coupled between the SDRAM 321 and the processor bus 323.

Although the present invention has been described with reference to several embodiments shown in the drawings, the invention is not limited to these embodiments. Rather, the invention is limited only by the appended claims, which include within their scope all equivalent devices or methods which operate according to the principles of the invention as described.

I claim:

1. A memory device in a single integrated circuit comprising:

at least one array of memory cells arranged in rows and columns, each of the rows having a row line and each of the columns having a pair of complementary digit lines;

a row address circuit coupled to the address bus for activating a row line corresponding to a row address coupled to the row address circuit through the address bus;

a column address circuit coupled to the address bus for selecting a column for a memory access that corresponds to a column address coupled to the column address circuit through the address bus;

at least one antifuse circuit, each antifuse circuit having an antifuse and being coupled to receive a strobe signal, each antifuse circuit being structured to generate an output in response to the strobe signal; and a timing circuit comprising:
   a model antifuse structured to provide a voltage;
   a charging circuit coupled between a voltage source and the model antifuse and coupled to receive a trigger signal, the charging circuit being structured to charge the model antifuse from the voltage source in response to the trigger signal; and
   a voltage detection circuit having an input coupled to receive the voltage provided by the model antifuse and an output, the voltage detection circuit being structured to generate an initialization signal at the output in response to the trigger signal until the voltage provided by the model antifuse rises to a threshold voltage, the initialization signal being generated to initialize the memory device.

2. The memory device of claim 1 wherein the model antifuse comprises two antifuses connected in parallel between the input of the voltage detection circuit and a voltage reference.

3. The memory device of claim 1 wherein the charging circuit comprises:
   a flip-flop circuit having a delay circuit and an input coupled to receive the trigger signal as a single pulse, the flip-flop circuit having an output and being structured to generate a grounding signal at its output as a single pulse with a duration longer than a duration of the trigger signal;
   one or more grounding transistors coupled between the model antifuse and a ground voltage reference, the grounding transistors being structured to couple the model antifuse to the ground voltage reference in response to the grounding signal; and
   a plurality of transistors coupled between a voltage source and the model antifuse, at least one of the transistors being coupled to receive the initialization signal from the output of the voltage detection circuit and being structured to couple the voltage source to the model antifuse while the initialization signal is being generated.

4. The memory device of claim 3 wherein the voltage detection circuit comprises:
   an inverter having an input coupled to the model antifuse and an output and being structured to generate the initialization signal as a single pulse in response to the grounding signal, the inverter being structured to terminate the initialization signal pulse when the voltage provided by the model antifuse rises to the threshold voltage; and
   a latch circuit coupled to the input of the inverter, the latch circuit being structured to latch the input of the inverter after the voltage provided by the model antifuse rises to the threshold voltage.

5. The memory device of claim 1, further comprising a control logic circuit having a mode register and a plurality of inputs coupled to receive respective command signals, the control logic circuit being structured to generate the trigger signal as a load mode register command in response to the command signals to program the mode register, the load mode register command being provided to the charging circuit.

6. The memory device of claim 5, further comprising a plurality of registers coupled to receive the initialization signal from the output of the voltage detection circuit, and being structured to be put in an initial state in response to the initialization signal.

7. The memory device of claim 1, further comprising a logic circuit having a first input coupled to receive a power up pulse, a second input coupled to the output of the voltage detection circuit to receive the initialization signal, and an output coupled to the antifuse circuits, the logic circuit being structured to generate the strobe signal at its output in response to the power up pulse or the initialization signal.

8. A method for strobing antifuse circuits in a memory device comprising:
   generating a trigger signal;
   generating a strobe signal in response to the trigger signal;
   charging a model antifuse in response to the trigger signal;
   applying the strobe signal to strobe the antifuse circuits in the memory device; and
   terminating the strobe signal when the model antifuse has been charged to a predetermined magnitude.

9. The method of claim 8 wherein the step of generating a trigger signal comprises:
   receiving high level command signals;
   generating a load mode register command in response to the high level command signals;
   programming a mode register in the memory device in response to the load mode register command;
   generating a trigger signal in response to the load mode register command; and
   terminating the trigger signal after a predetermined delay from the generation of the load mode register command.

10. The method of claim 8 wherein the step of generating a strobe signal comprises generating a strobe signal as a single pulse having a duration generated in response to the trigger signal.

11. The method of claim 10 wherein the step of providing electrical charge to a model antifuse comprises:
   discharging a model antifuse during a pulse of the trigger signal; and
   providing electrical charge to the model antifuse while the strobe signal is being generated.

12. The method of claim 11 wherein the step of terminating the strobe signal comprises terminating the pulse of the strobe signal when a voltage of the model antifuse rises above a threshold voltage in response to the electrical charge provided to the model antifuse.

13. A method for initializing a memory device comprising:
   generating a trigger signal;
   generating an initialization signal in response to the trigger signal;
   charging an antifuse structure in response to the trigger signal;
   applying the initialization signal to the memory device to initialize the memory device; and
   terminating the initialization signal when the antifuse structure has been charged to a predetermined level.

14. The method of claim 13 wherein the step of generating a trigger signal comprises:

providing high level command signals to the memory device;

generating a load mode register command in response to the high level command signals;

programming a mode register in the memory device in response to the load mode register command; and generating a trigger signal in response to the load mode register command.

15. The method of claim 14 wherein the step of charging an antifuse structure comprises charging an antifuse structure in a model antifuse circuit structured to be similar to each of a plurality of antifuse circuits in the memory device, a voltage of the antifuse structure rising in response to the charge at a rate similar to a rate at which a voltage of an antifuse in each antifuse circuit rises when the antifuse circuits are being read.

16. The method of claim 15 wherein the step of charging an antifuse structure further comprises:

discharging a pair of antifuses connected in parallel; and charging the pair of antifuses while the initialization signal is being generated.

17. The method of claim 13 wherein the step of applying the initialization signal to the memory device comprises:

generating a read signal while the initialization signal is being generated;

applying the read signal to a plurality of antifuse circuits in the memory device to read the antifuse circuits, each antifuse circuit generating a signal in response to the read signal; and applying the initialization signal to registers in the memory device to initialize the registers.

18. The method of claim 17 wherein the step of terminating the initialization signal comprises terminating the initialization signal to generate a pulse when a voltage of the antifuse structure rises above a threshold voltage in response to the charge.

19. A method of operating a computer system having a memory device, the method comprising:

generating a trigger signal;

generating a strobe signal in response to the trigger signal;

charging a model antifuse in response to the trigger signal;

applying the strobe signal to strobe antifuse circuits in the memory device; and terminating the strobe signal when the model antifuse has been charged to a predetermined magnitude.

20. The method of claim 19 wherein the step of generating a trigger signal comprises:

receiving high level command signals;

generating a load mode register command in response to the high level command signals;

programming a mode register in the memory device in response to the load mode register command;

generating a trigger signal in response to the load mode register command; and terminating the trigger signal after a predetermined delay from the generation of the load mode register command.

21. The method of claim 20 wherein the step of generating a strobe signal comprises generating a strobe signal as a single pulse having a duration generated in response to the trigger signal.

22. The method of claim 21 wherein the step of charging a model antifuse comprises:

discharging a model antifuse during a pulse of the trigger signal; and charging the model antifuse while the strobe signal is being generated.

23. The method of claim 22 wherein the step of terminating the strobe signal comprises terminating the pulse of the strobe signal when a voltage of the model antifuse rises above a threshold voltage in response to the charging of the model antifuse.

* * * * *